(12) United States Patent
Abe et al.

(10) Patent No.: US 10,847,739 B2
(45) Date of Patent: Nov. 24, 2020

(54) DISPLAY DEVICE HAVING LARGER OPENINGS ON INNER SIDES OF ANODE ELECTRODES IN DISPLAY REGION THAN ON INNER SIDES OF ANODE ELECTRODES IN PERIPHERAL DISPLAY REGION

(71) Applicant: Sharp Kabushiki Kaisha, Sakai (JP)

(72) Inventors: Kaoru Abe, Sakai (JP); Takeshi Yaneda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/471,053

(22) PCT Filed: Sep. 21, 2017

(86) PCT No.: PCT/JP2017/034104
§ 371 (c)(1),
(2) Date: Jun. 19, 2019

(87) PCT Pub. No.: WO2019/058485
PCT Pub. Date: Mar. 28, 2019

(65) Prior Publication Data
US 2019/0379002 A1 Dec. 12, 2019

(51) Int. Cl.
*H01L 51/50* (2006.01)
*H01L 27/32* (2006.01)
*H01L 51/52* (2006.01)

(52) U.S. Cl.
CPC ...... *H01L 51/5012* (2013.01); *H01L 27/3248* (2013.01); *H01L 27/3276* (2013.01); *H01L 51/5206* (2013.01); *H01L 51/5221* (2013.01)

(58) Field of Classification Search
CPC ............. H01L 51/5012; H01L 51/5206; H01L 27/3248; H01L 27/3276; H01L 51/5221; H01L 27/326; H01L 51/50; H01L 51/52; H01L 37/32; H01L 27/32; G09F 9/30
USPC ......................................................... 257/79
See application file for complete search history.

(56) References Cited

U.S. PATENT DOCUMENTS

| 6,246,070 B1 * | 6/2001 | Yamazaki | ......... G02F 1/136227 |
| | | | 257/40 |
| 6,278,131 B1 * | 8/2001 | Yamazaki | ........... H01L 27/1237 |
| | | | 257/347 |
| 6,399,988 B1 * | 6/2002 | Yamazaki | ........... H01L 27/1214 |
| | | | 257/344 |

(Continued)

FOREIGN PATENT DOCUMENTS

| JP | 2005-315960 A | 11/2005 |
| JP | 2006-178475 A | 7/2006 |

(Continued)

OTHER PUBLICATIONS

Official Communication issued in International Patent Application No. PCT/JP2017/034104, dated Nov. 28, 2017.

*Primary Examiner* — Alexander O Williams
(74) *Attorney, Agent, or Firm* — Keating & Bennett, LLP

(57) ABSTRACT

Openings, which are provided on the inner sides of anode electrodes formed in a display region, are larger than openings, which are provided on the inner sides of anode electrodes formed in a peripheral display region. A light-emitting layer formed in the display region has equal shape and equal size to a light-emitting layer formed in the peripheral display region.

14 Claims, 10 Drawing Sheets

(56) References Cited

U.S. PATENT DOCUMENTS

| | | | | |
|---|---|---|---|---|
| 6,524,877 B1* | 2/2003 | Nakazawa | H01L 27/12 | 257/40 |
| 6,545,359 B1* | 4/2003 | Ohtani | H01L 23/53223 | 257/758 |
| 6,590,229 B1* | 7/2003 | Yamazaki | H01L 27/124 | 257/71 |
| 6,677,613 B1* | 1/2004 | Yamazaki | G02F 1/13454 | 257/40 |
| 7,303,635 B2* | 12/2007 | Yamaguchi | H01L 27/3211 | 118/721 |
| 2001/0004190 A1* | 6/2001 | Nishi | H01L 51/5284 | 313/506 |
| 2002/0021268 A1* | 2/2002 | Yamazaki | H01L 27/3211 | 345/80 |
| 2004/0032637 A1* | 2/2004 | Imamura | G06F 3/1446 | 359/245 |
| 2005/0156174 A1* | 7/2005 | Murakami | H01L 29/78633 | 257/72 |
| 2006/0146035 A1 | 7/2006 | Cha et al. | | |
| 2008/0263630 A1 | 10/2008 | Harada et al. | | |
| 2009/0309813 A1 | 12/2009 | Fujita | | |
| 2011/0141376 A1 | 6/2011 | Tsubata | | |
| 2015/0070616 A1 | 3/2015 | Ogasawara et al. | | |
| 2015/0243231 A1 | 8/2015 | Yokozeki | | |
| 2015/0356937 A1* | 12/2015 | Fujikawa | G09G 3/3648 | 345/87 |
| 2016/0126295 A1 | 5/2016 | Sato | | |
| 2016/0260822 A1* | 9/2016 | Okamoto | H01L 29/78696 | |
| 2016/0285039 A1* | 9/2016 | Kim | H01L 51/5284 | |
| 2016/0293732 A1* | 10/2016 | Kurata | H01L 27/1225 | |
| 2016/0306472 A1* | 10/2016 | Park | H01L 27/323 | |
| 2016/0320878 A1* | 11/2016 | Hong | G06F 1/1652 | |
| 2016/0322503 A1* | 11/2016 | Tezuka | H01L 27/1255 | |
| 2017/0125405 A1* | 5/2017 | Tanaka | H01G 4/105 | |
| 2017/0179424 A1* | 6/2017 | Lee | H01L 51/0097 | |
| 2017/0249910 A1 | 8/2017 | Tamaki | | |
| 2017/0333280 A1* | 11/2017 | Black | A61H 7/005 | |
| 2017/0365813 A1* | 12/2017 | Kamiya | G06F 3/0416 | |
| 2017/0373124 A1* | 12/2017 | Yang | H01L 27/3246 | |
| 2018/0006273 A1* | 1/2018 | Kim | H01L 27/326 | |
| 2018/0019432 A1* | 1/2018 | Kurasawa | G02F 1/136227 | |
| 2018/0059869 A1* | 3/2018 | Ma | G06F 3/044 | |
| 2018/0090544 A1* | 3/2018 | Gunji | H01L 27/323 | |
| 2018/0129327 A1* | 5/2018 | Kurasawa | H01L 51/5253 | |
| 2018/0151834 A1* | 5/2018 | Kanaya | H01L 51/5246 | |
| 2018/0151837 A1* | 5/2018 | Furuie | H01L 27/3251 | |
| 2018/0203554 A1* | 7/2018 | Cho | H01L 27/323 | |
| 2018/0232089 A1* | 8/2018 | Ozawa | G06F 1/1652 | |
| 2018/0233076 A1* | 8/2018 | Miyanaga | G09G 3/2003 | |
| 2018/0299603 A1* | 10/2018 | Lee | G02F 1/133528 | |
| 2018/0301644 A1* | 10/2018 | Ito | H01L 51/5284 | |
| 2018/0335658 A1* | 11/2018 | Fujikawa | G02F 1/13338 | |
| 2018/0342185 A1* | 11/2018 | Lee | G01R 27/08 | |
| 2019/0057632 A1* | 2/2019 | Kim | G09G 3/3291 | |
| 2019/0155430 A1* | 5/2019 | Hwang | G06F 3/044 | |
| 2019/0205596 A1* | 7/2019 | Kim | B06B 1/0692 | |
| 2019/0363146 A1* | 11/2019 | Takahashi | H05B 33/22 | |
| 2019/0363267 A1* | 11/2019 | Tanaka | H01L 51/524 | |
| 2019/0363275 A1* | 11/2019 | Ochi | H05B 33/04 | |
| 2019/0363290 A1* | 11/2019 | Watanabe | H01L 51/5253 | |
| 2019/0363291 A1* | 11/2019 | Sakamoto | H01L 51/502 | |
| 2019/0364671 A1* | 11/2019 | Mihotani | H01L 27/3276 | |
| 2019/0371236 A1* | 12/2019 | Sakai | G09G 3/3233 | |
| 2020/0105828 A1* | 4/2020 | Ryu | G06F 3/042 | |
| 2020/0119123 A1* | 4/2020 | Okabe | H01L 51/50 | |

FOREIGN PATENT DOCUMENTS

| | | | | |
|---|---|---|---|---|
| JP | 2007-011556 A | | 1/2007 | |
| JP | 2009-081097 A | | 4/2009 | |
| JP | 2009-300556 A | | 12/2009 | |
| JP | 2011-197084 A | | 10/2011 | |
| JP | 2012084301 A | * | 4/2012 | F21S 2/00 |
| JP | 2014-098909 A | | 5/2014 | |
| JP | 2015-158572 A | | 9/2015 | |
| JP | 2016-090812 A | | 5/2016 | |
| JP | 2017-151279 A | | 8/2017 | |
| WO | 2010/024058 A1 | | 3/2010 | |
| WO | 2013/157285 A1 | | 10/2013 | |

* cited by examiner

DISPLAY DEVICE HAVING LARGER OPENINGS ON INNER SIDES OF ANODE ELECTRODES IN DISPLAY REGION THAN ON INNER SIDES OF ANODE ELECTRODES IN PERIPHERAL DISPLAY REGION

TECHNICAL FIELD

The disclosure relates to a display device.

BACKGROUND ART

PTL 1 discloses a light-emitting apparatus in which a cathode electrode wiring line connected to a cathode electrode is provided on the outer side of an effective region, in which a plurality of pixels including light emitting elements are provided, with the cathode electrode wiring line provided surrounding the effective region. First to third power source lines connected to pixel electrodes are provided between the cathode electrode wiring line and the effective region.

PTL 2 discloses an electro-optical apparatus in which the height from the base of a dummy function layer to the top of a partition is higher than the height from the base of a function layer to the top of the partition.

PTL 3 discloses an organic EL device in which adjacent inner-partition regions are provided so that an end portion of one of the inner-partition regions is provided in a position shifted, in the longitudinal direction, from an end portion of the other inner-partition region.

CITATION LIST

Patent Literature

PTL 1: JP 2015-158572 A
PTL 2: JP 2009-081097 A
PTL 3: JP 2007-11556 A

SUMMARY

Technical Problem

According to the configurations of PTL 1 to 3, it is necessary to provide a dummy region, which is not used for display, in the periphery of a display region. This imparts a certain limit on the size of the display region.

Having been achieved to solve the above-described problem, an object of the disclosure is to broaden the overall region, in a display surface, that is capable of display.

Solution to Problem

In order to solve the above-described problem, a display device according to one aspect of the disclosure includes: a first electrode; a flattening film formed in a layer above the first electrode and covering an end portion of the first electrode; a light-emitting layer formed in a layer above the first electrode; and a second electrode formed in a layer above the light-emitting layer. The display device includes a first display region, and a second display region formed in a periphery of the first display region. A first opening formed on an inner side of a first pixel electrode, the first pixel electrode being the first electrode formed in the first display region, is larger than a second opening formed on an inner side of a second pixel electrode, the second pixel electrode being the first electrode formed in the second display region. A first light-emitting layer, the first light-emitting layer being the light-emitting layer formed in the first display region, has equal shape and equal size to a second light-emitting layer, the second light-emitting layer being the light-emitting layer formed in the second display region.

Advantageous Effects of Disclosure

According to an aspect of the disclosure, the overall displayable region in a display surface can be broadened.

DESCRIPTION OF EMBODIMENTS

First Embodiment

Example of Configuration of Display Device 1

Figure 1:
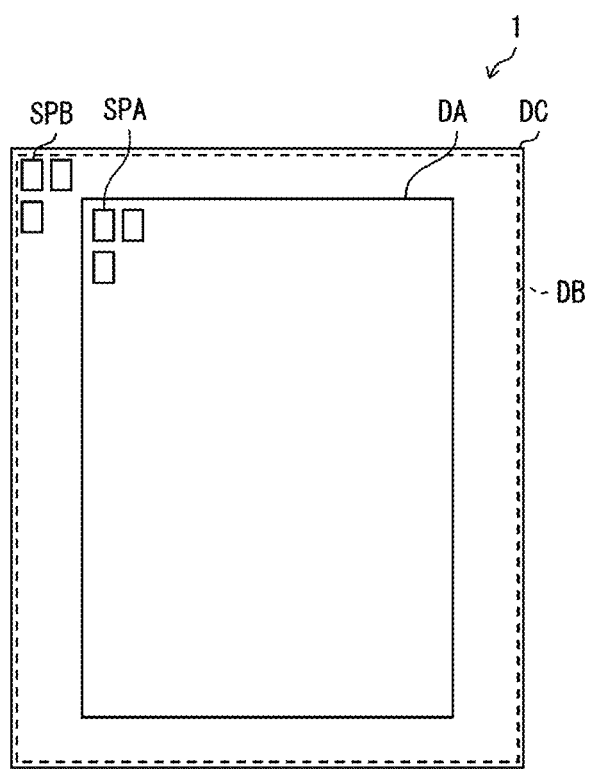
FIG. 1 is a plan view illustrating an example of the configuration of a display device according to a first embodiment.

FIG. 1 is a plan view illustrating an example of the configuration of a display device 1 according to a first embodiment. The display device 1 includes a display region DA (a first display region), a peripheral display region DB (a second display region), and a frame region DC, arranged in a display surface of the display device 1. The peripheral display region DB and the frame region DC are formed in the periphery of the display region DA. In the present embodiment, the entire frame region DC corresponds to the peripheral display region DB. In other words, the size of the peripheral display region DB is equal to the size of the frame region DC.

The display device 1 includes a group of subpixels SPA (first pixels) formed in the display region DA, and a group of subpixels SPB (second pixels) formed in the peripheral display region DB. The display device 1 displays information in the display region DA and the peripheral display region DB.

Example of Cross-Sectional Configuration of Display Device 1

Figure 2:
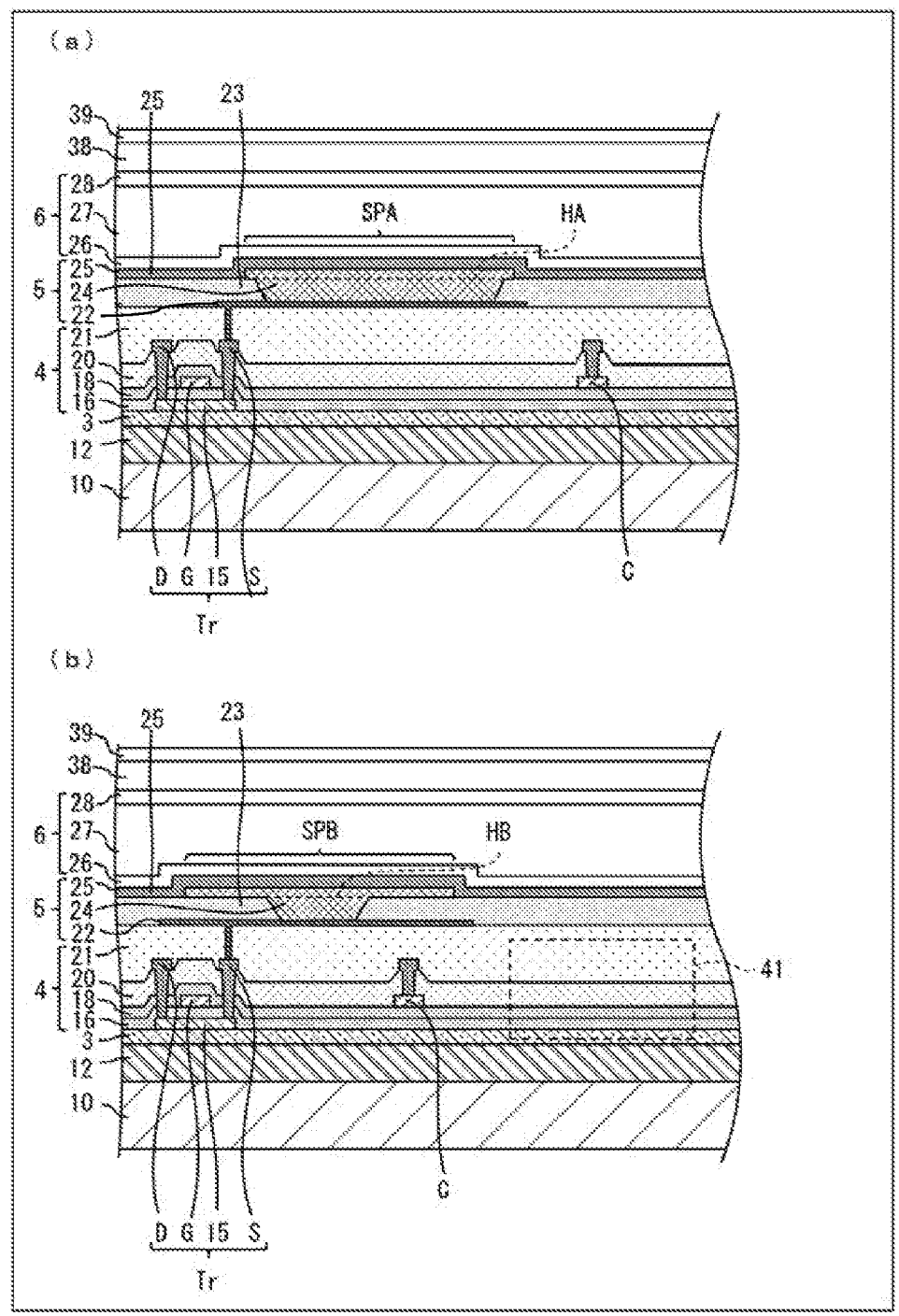
FIG. 2 is a cross-sectional view illustrating an example of the configuration of the display device according to the first embodiment.

FIG. 2 is a cross-sectional view illustrating an example of the configuration of the display device 1 according to the first embodiment. (a) of FIG. 2 illustrates an example of the cross-section of the display region DA in the display device 1, and (b) of FIG. 2 illustrates an example of the cross-section of the peripheral display region DB in the display device 1. The display device 1 illustrated in FIG. 2 is a top-emitting device that emits light upward, and includes, in order from the bottom, a base material 10, a resin layer 12, a barrier layer 3 (a base coat layer), a TFT layer 4, a light-emitting element layer 5, a sealing layer 6, an adhesive layer 38, and a function film 39.

Examples of the material of the resin layer 12 include polymide, epoxy, and polyamide. Examples of the material of the base material 10 include polyethylene terephthalate (PET).

The barrier layer 3 is a layer that inhibits moisture or impurities from reaching the TFT layer 4 or a light emitting element layer 5 when the display device 2 is being used, and can be fabricated from a silicon oxide film, a silicon nitride film, or a silicon oxinitride film, or by a layered film of these, which are formed using CVD.

The TFT layer 4 includes a semiconductor film 15, an inorganic insulating film 16 formed in a layer above the semiconductor layer 15, a gate electrode G formed in a layer above the inorganic insulating film 16, an inorganic insulating film 18 formed in a layer above the gate electrode G, a capacitance electrode C formed in a layer above the inorganic insulating film 18, an inorganic insulating film 20 formed in a layer above the capacitance electrode C, a source electrode S and a drain electrode D both formed in a layer above the inorganic insulating film 20, and a flattening film 21 formed in a layer above the source electrode S and the drain electrode D.

A thin film transistor Tr (light emission control transistor) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of, for example, low temperature polysilicon (LTPS) or an oxide semiconductor. Note that in FIG. 2, the TFT is illustrated as having a top gate structure in which the semiconductor film 15 is the channel.

The inorganic insulating films 16, 18, and 20 can be fabricated from a silicon oxide (SiOx) film or a silicon nitride (SiNx) film, or a layered film of these, formed using CVD, for example. The flattening film (interlayer insulating film) 21 can be constituted, for example, by a coatable photosensitive organic material, such as a polyimide, an acrylic, or the like.

The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), and copper (Cu).

The light-emitting element layer 5 (e.g., an organic light emitting diode layer) includes an anode electrode 22 (a first electrode) formed in a layer above the flattening film 21, a flattening film 23 that defines the subpixels SPA or SPB in an active region (a region overlapping the light-emitting element layer 5), a light-emitting layer 24 formed in a layer above the anode electrode 22, and a cathode electrode 25 (a second electrode) formed in a layer above the light-emitting layer 24. A light emitting element (e.g., an organic light emitting diode, or OLED) is configured to include the anode electrode 22, the light-emitting layer 24, and the cathode electrode 25. In the display device 1, the anode electrode 22 and the cathode electrode 25 can have the opposite arrangement.

The flattening film 23 surrounds the end portions of the anode electrode 22. The light-emitting layer 24 is formed in a region (a light emitting region) surrounded by the flattening film 23, using vapor deposition or an ink-jet method. In a case where the light-emitting element layer 5 is an organic light emitting diode (OLED) layer, a hole injection layer, a hole transport layer, the light-emitting layer 24, an electron transport layer, and an electron injection layer are layered above a bottom face of the flattening film 23 (a part where the anode electrode 22 is exposed). Here, the layers aside from the light-emitting layer 24 can be common layers.

The anode electrode 22 is formed by layering indium tin oxide (ITO) and an alloy containing Ag, for example, and has light reflectivity (to be described below in more detail). The cathode electrode 25 can be fabricated from a translucent conductive material such as ITO or indium zinc oxide (IZO).

In a case where the light-emitting element layer 5 is an OLED layer, positive holes and electrons recombine inside the light-emitting layer 24 in response to a drive current between the anode electrode 22 and the cathode electrode 25, and light is emitted as a result of excitons, which are generated by the recombination, falling into a ground state. Since the cathode electrode 25 is translucent and the anode electrode 22 is light-reflective, the light emitted from the light-emitting layer 24 travels upwards and results in top emission.

The light emitting element layer 5 is not limited to OLED element configurations, and may be an inorganic light emitting diode or a quantum dot light emitting diode.

The sealing layer 6 is translucent, and includes an inorganic sealing film 26 that covers the cathode electrode 25, an organic sealing film 27 formed in a layer above the inorganic sealing film 26, and an inorganic sealing film 28 that covers the organic sealing film 27. The inorganic sealing films 26 and 28 may be made of a silicon oxide film, silicon nitride film, or silicon oxynitride film formed by CVD using a mask, or a layered film thereof, for example. The organic sealing film 27 is thicker than the inorganic sealing films 26 and 28, is a translucent organic film, and can be fabricated from a coatable photosensitive organic material such as a polyimide or an acrylic. For example, after coating the inorganic sealing film 26 with an ink containing such an organic material using an ink-jet method, the ink is cured by UV irradiation. The sealing layer 6 covers the light emitting element layer 5 and inhibits foreign matters, such as water and oxygen, from infiltrating to the light emitting element layer 5.

The functional film 39 may have, for example, an optical compensation function, a touch sensor function, a protection function, or the like.

Example of Structures of Subpixels SPA and SPB

Figure 3:
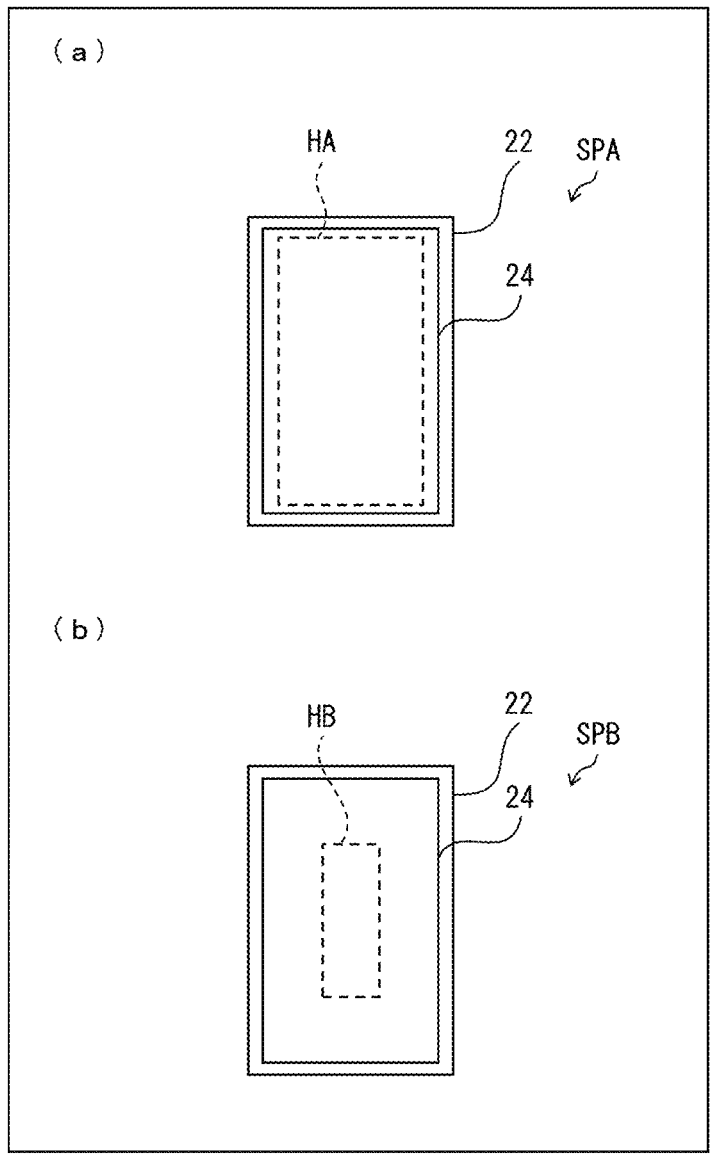
FIG. 3 is a plan view illustrating the structure of subpixels according to the first embodiment.

FIG. 3 is a plan view illustrating an example of the structures of the subpixels SPA and SPB according to the first embodiment. As illustrated in (a) of FIG. 2 and (a) of FIG. 3, each subpixel SPA includes at least the flattening film 23 (a first flattening film), which has an opening HA (a first opening), and the light-emitting layer 24 (a first light-emitting layer), which is arranged in a layer above the flattening film 23. In the subpixel SPA, the flattening film 23 surrounds the entire periphery of the opening HA. The light-emitting layer 24 is formed completely occupying at least the opening HA. The surface area of the light-emitting layer 24 is greater than the surface area of the opening HA. Of the light-emitting layer 24, the range that overlaps with the opening HA contributes to the display of information in the display region DA.

As illustrated in (b) of FIG. 2 and (b) of FIG. 3, each subpixel SPB includes at least the flattening film 23, which has an opening HB (a second opening), and the light-emitting layer 24 (a second light-emitting layer), which is arranged in a layer above the flattening film 23 and has equal shape and equal size as the light-emitting layer 24 in the subpixel SPA. In the subpixel SPB, the flattening film 23 surrounds the entire periphery of the opening HB. The light-emitting layer 24 is formed completely occupying at least the opening HB. The surface area of the light-emitting layer 24 is greater than the surface area of the opening HB. Of the light-emitting layer 24, the range that overlaps with the opening HB contributes to the display of information in the peripheral display region DB.

The "equal shape and equal size" mentioned above means that in a case where the luminescent material of the light-emitting layer 24 is deposited in the display region DA and the peripheral display region DB using masks having mask patterns of equal shape and equal size, the light-emitting layers 24 of equal shape and equal size will effectively be formed in the display region DA and the peripheral display region DB. Accordingly, the light-emitting layer 24 in the subpixel SPA and the light-emitting layer 24 in the subpixel SPB do not necessarily have to have exactly equal shape and equal size.

As illustrated in FIG. 3, the openings HA, which are provided on the inner sides of the anode electrodes 22 formed in the display region DA, are larger than the openings HB, which are provided on the inner sides of the anode electrodes 22 formed in the peripheral display region DB. Furthermore, the light-emitting layer 24 formed in the display region DA has equal shape and equal size to the light-emitting layer 24 formed in the peripheral display region DB. When manufacturing the display device 1, the light-emitting layers 24 are deposited through mask openings having equal size, which are formed in a fine metal masks (not illustrated) for depositing the luminescent material, in both the display region DA and the peripheral display region DB. In other words, the size of the mask opening formed in the range of the fine metal mask corresponding to the display region DA is equal to the size of the mask openings formed in the range of the fine metal mask corresponding to the peripheral display region DB.

The openings HB are smaller than the openings HA, and thus even if there is a lower precision in the deposition pattern used when depositing the luminescent material in the peripheral display region DB, the light-emitting layer 24 is formed so as to completely cover the openings HB in the peripheral display region DB. Subpixels SPB that function correctly can therefore be formed in the peripheral display region DB. By arranging such subpixels SPB in the peripheral display region DB, the display device 1 can use both the display region DA and the peripheral display region DB to display information. With the display device 1, a region in the periphery of the display region DA which in known display devices does not display anything (a dummy region) can be used as the peripheral display region DB, which is capable of displaying information. Accordingly, the display device 1 can make the surface area of the entire region, in the display surface, that is capable of display broader than with known techniques.

The openings HB in the flattening film 23 formed in the peripheral display region DB are smaller than the openings HA in the flattening film 23 formed in the display region DA, and the peripheral display region DB has a poorer display accuracy than the display region DA. In other words, the display region DA is suited to the display of high-resolution images, whereas the peripheral display region DB is suited to the display of low-resolution images.

To ensure sufficient light emission from the light-emitting layer 24, contact holes cannot be provided in the display region DA so as to overlap parts of the light-emitting layer 24 filled with the openings HA. Thus, as illustrated in (a) of FIG. 2, in the display region DA, contact holes of the thin film transistor Tr are formed in positions that do not overlap the openings HA. Likewise, a contact hole of the capacitance electrode C is formed in a position that does not overlap the openings HA.

In the peripheral display region DB, the parts of the light-emitting layer 24 that do not overlap the openings HB do not function as an active light-emitting layer 24. Thus, as illustrated in (b) of FIG. 2, in the peripheral display region DB, the contact holes of the thin film transistor Tr can be formed in parts of the light-emitting layer 24 that do not overlap the opening HB (parts that overlap the opening HA in the display region DA). Likewise, a contact hole of the capacitance electrode C can be formed in a part of the light-emitting layer 24 that does not overlap the opening HB. Thus, in the peripheral display region DB, the thin film transistor Tr and the capacitance electrode C can both be provided closer to the opening HB. As a result, an empty space 41 is formed in the peripheral display region DB, and an additional thin film transistor can be provided in the empty space 41. Furthermore, various types of display control circuits that include additional thin film transistors, such as a monolithic gate driver or a monolithic source driver, can be formed in the peripheral display region DB. A display device 1 including a display control circuit formed in the peripheral display region DB can therefore be achieved.

Other Examples of Configuration of Display Device 1

Figure 4:
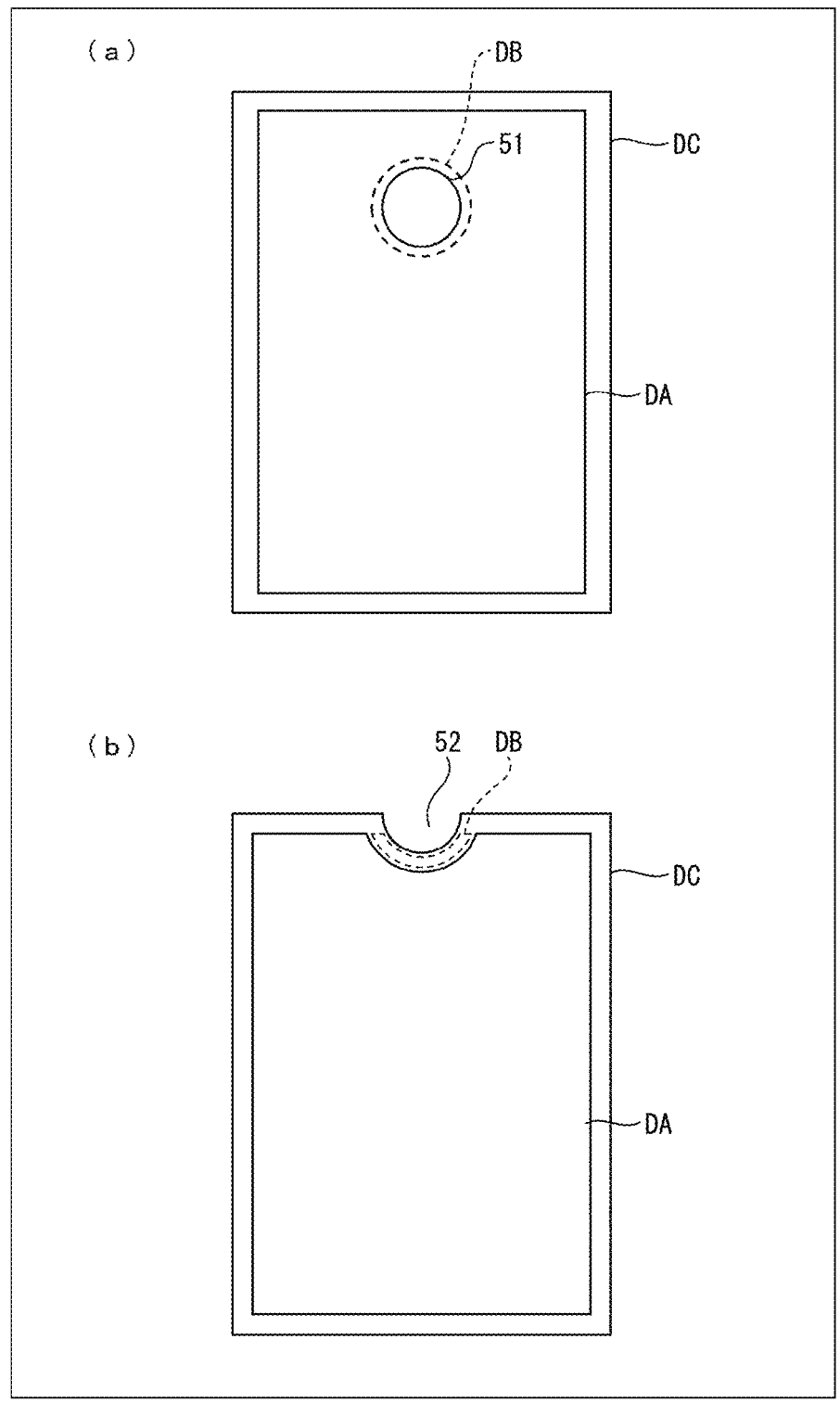
FIG. 4 is a plan view illustrating other examples of the configuration of the display device according to the first embodiment.

FIG. 4 is a plan view illustrating other examples of the configuration of the display device 1 according to the first embodiment. In (a) of FIG. 4, the display device 1 includes the display region DA, the peripheral display region DB, the frame region DC, and a notch part 51. The peripheral display region DB corresponds to part of the frame region DC. In other words, a plurality of subpixels SPB are formed in part of the frame region DC. The notch part 51, formed by cutting out part of the display region DA, is formed in the interior of the display region DA. The peripheral display region DB is formed in the periphery of the display region DA, and is also formed in the periphery of the notch part 51. To be more specific, the peripheral display region DB is formed between the display region DA and the notch part 51 in the planar direction of the display device 1, surrounding the notch part 51.

In (b) of FIG. 4, the display device 1 includes the display region DA, the peripheral display region DB, the frame region DC, and a notch part 52. The frame region DC is formed surrounding the display region DA. The notch part 52 is formed at an edge of the display device 1, by cutting out a part of the display region DA and a part of the frame region DC. The peripheral display region DB corresponds to part of the frame region DC. In other words, a plurality of subpixels SPB are formed in part of the frame region DC. The peripheral display region DB is formed in the periphery of the display region DA, and is also formed in the periphery of the notch part 52. To be more specific, the peripheral display region DB is formed between the display region DA and the notch part 52 in the planar direction of the display device 1 in contact with the notch part 52.

Arrangement of Monolithic Gate Driver 53

Figure 5:
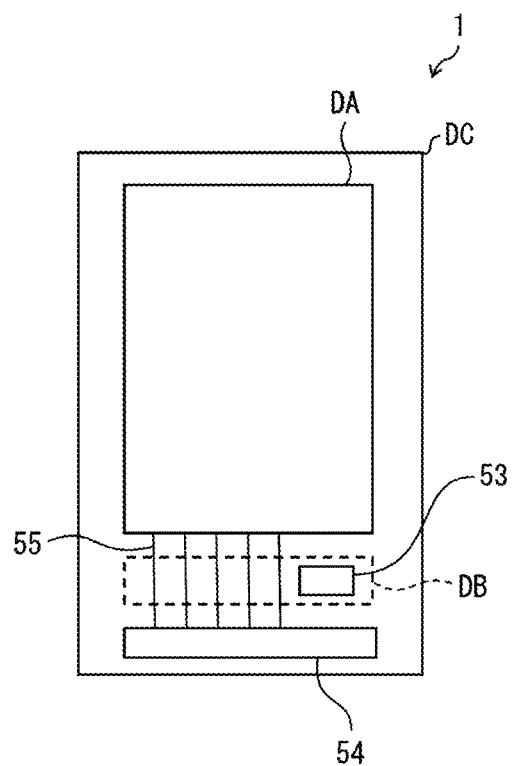
FIG. 5 is a plan view illustrating, in more detail, an example of the configuration of the display device according to the first embodiment.

FIG. 5 is a plan view illustrating, in more detail, an example of the configuration of the display device 1 according to the first embodiment. The display device 1 illustrated in FIG. 5 includes the display region DA, the peripheral display region DB, the frame region DC, a monolithic gate driver 53, a terminal section 54, and a plurality of lead wiring lines 55. The peripheral display region DB corresponds to part of the frame region DC. In other words, a plurality of the subpixels SPB are formed in part of the frame region DC. In FIG. 5, the peripheral display region DB is formed in the periphery of a lower side of the display region DA. The monolithic gate driver 53 is formed in the peripheral display region DB. The terminal section 54 is formed in the frame region DC. The lead wiring lines 55 are formed in the peripheral display region DB and the frame region DC so as to overlap the frame region DC.

The monolithic gate driver 53 is a type of display control circuit that controls displays in the display region DA and the peripheral display region DB. The terminal section 54 is a component to which is attached one end of a cable for electrically connecting the display device 1 with an external device. The plurality of lead wiring lines 55 are wiring lines which electrically connect the display region DA with the terminal section 54, and which transfer signals from the exterior to the display region DA.

Figure 6:
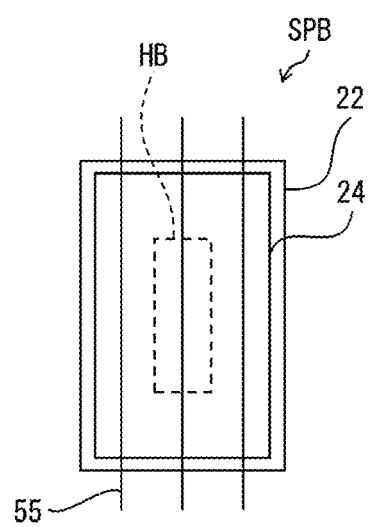
FIG. 6 is a plan view illustrating the arrangement of lead wiring lines.

FIG. 6 is a plan view illustrating the arrangement of the lead wiring lines 55. As illustrated in FIG. 6, the plurality of lead wiring lines 55 overlap the light-emitting layer 24 in the peripheral display region DB.

Modification

Figure 7:
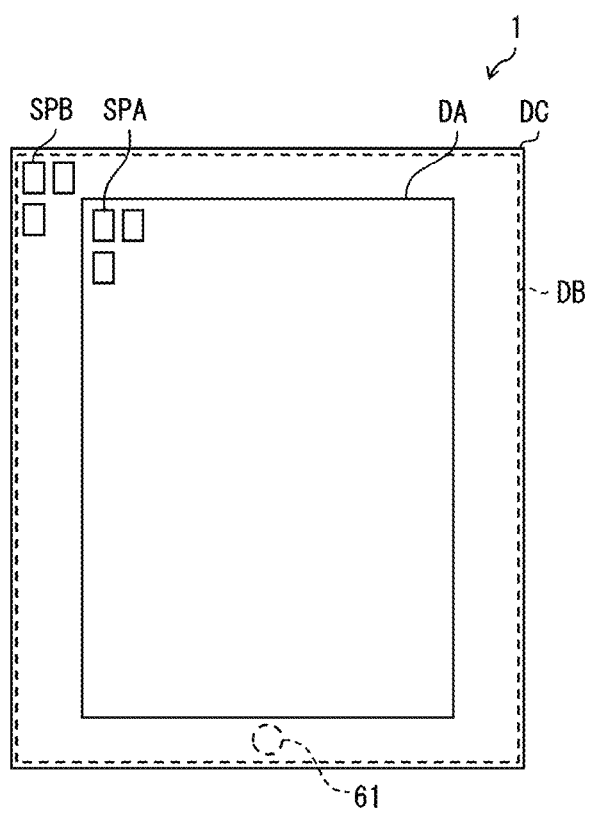
FIG. 7 is a plan view illustrating another example of the configuration of the display device according to the first embodiment.

FIG. 7 is a plan view illustrating another example of the configuration of the display device 1 according to the first embodiment. In FIG. 7, the display device 1 includes the display region DA, the peripheral display region DB, the frame region DC, and an authentication sensor 61. The authentication sensor 61 is disposed within a region, in a rear face on the opposite side from the display surface of the display device 1, that opposes the peripheral display region DB. The authentication sensor 61 is, for example, a fingerprint sensor that reads a user's fingerprint using light or ultrasonic waves.

Figure 8:
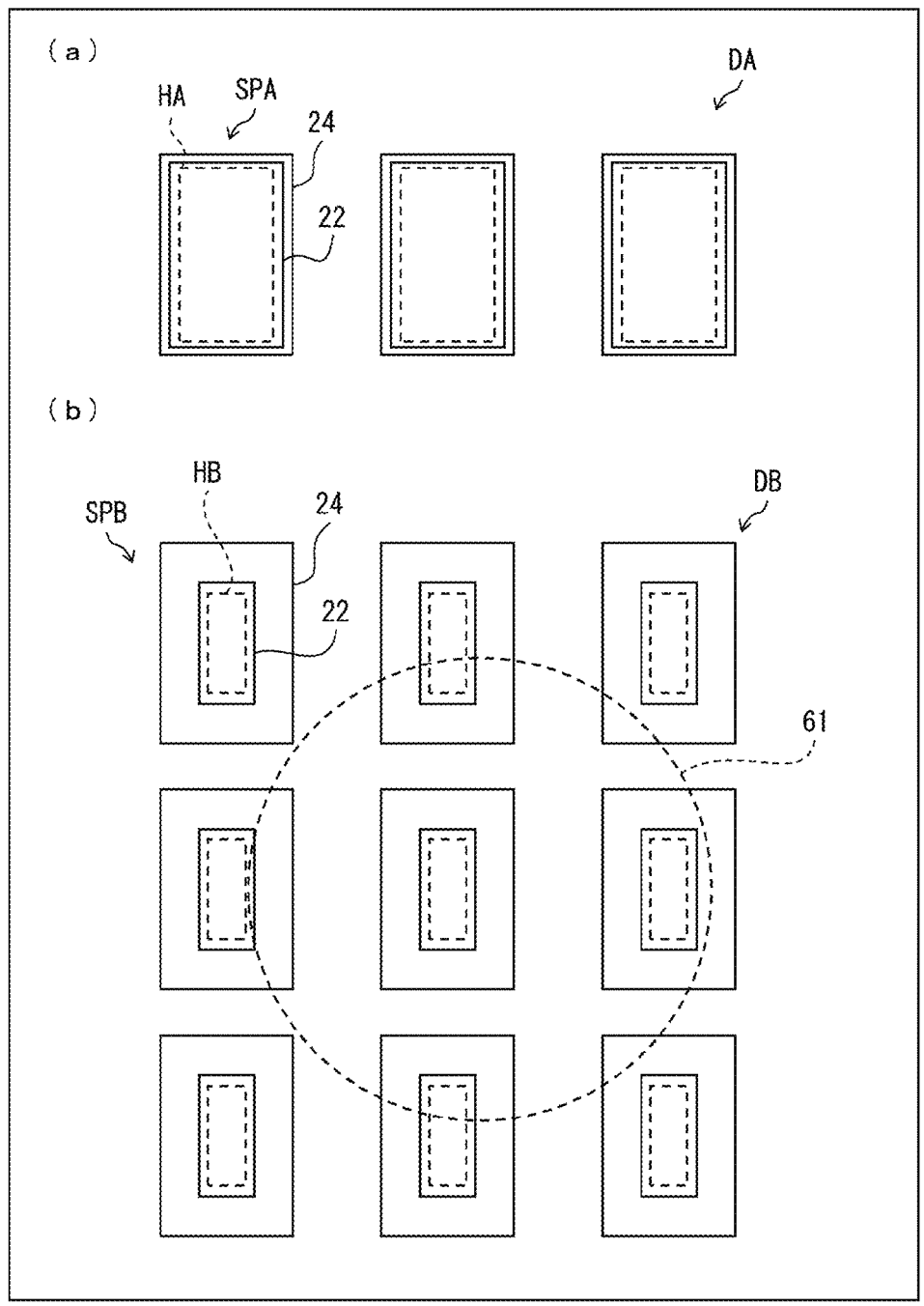
FIG. 8 is a plan view illustrating, in detail, the subpixels according to the first embodiment.

FIG. 8 is a plan view illustrating, in detail, the subpixels SPA and the subpixels SPB according to a modification of the first embodiment. As illustrated in these drawings, in the subpixels SPA, the anode electrode 22 (a first pixel electrode) is smaller than the light-emitting layer 24, and the opening HA in the flattening film 23 is smaller than the anode electrode 22. In the subpixels SPB, too, the anode electrode 22 (a second pixel electrode) is smaller than the light-emitting layer 24, and the opening HB in the flattening film 23 is smaller than the anode electrode 22. The light-emitting layer 24 in the subpixel SPB has equal shape and equal size to the light-emitting layer 24 in the subpixel SPA. The anode electrode 22 in the subpixel SPB is smaller than the anode electrode 22 in the subpixel SPA. The opening HB in the flattening film 23 in the subpixel SPB is smaller than the opening HA in the flattening film 23 in the subpixel SPA.

To summarize, the display device 1 illustrated in FIG. 8 includes the anode electrode 22, which is provided in each of a plurality of subpixels SPA; and an anode electrode 22, which is provided in each of a plurality of subpixels SPB, is larger than the opening HB, and is smaller than the anode electrode 22 of the subpixel SPA.

As illustrated in FIG. 8, the authentication sensor 61 is disposed in a rear face opposing the display surface of the display device 1. The authentication sensor 61 furthermore overlaps with a part where the smaller anode electrodes 22 are formed in the peripheral display region DB. Because each anode electrode 22 functions as a reflective electrode, the transmittance of light and ultrasonic waves in the peripheral display region DB increases as the surface area of the anode electrodes 22 formed in the peripheral display region DB decreases. The surface area of each anode electrode 22 in the peripheral display region DB overlapping the authentication sensor 61 is therefore smaller than the surface area of each anode electrode 22 in the display region DA. As such, the transmittance of light and ultrasonic waves is higher in the parts of the peripheral display region DB overlapping the authentication sensor 61 than in the display region DA. Furthermore, the wiring lines and thin film transistors are less dense in the peripheral display region DB than in the display region DA, which makes it easier for light and ultrasonic waves to pass through the peripheral display region DB. For these reasons, a sufficient amount of light or ultrasonic waves reaches the authentication sensor 61 formed overlapping the peripheral display region DB, and thus the accuracy of authentication by the authentication sensor 61 can be increased.

Second Embodiment

Figure 9:
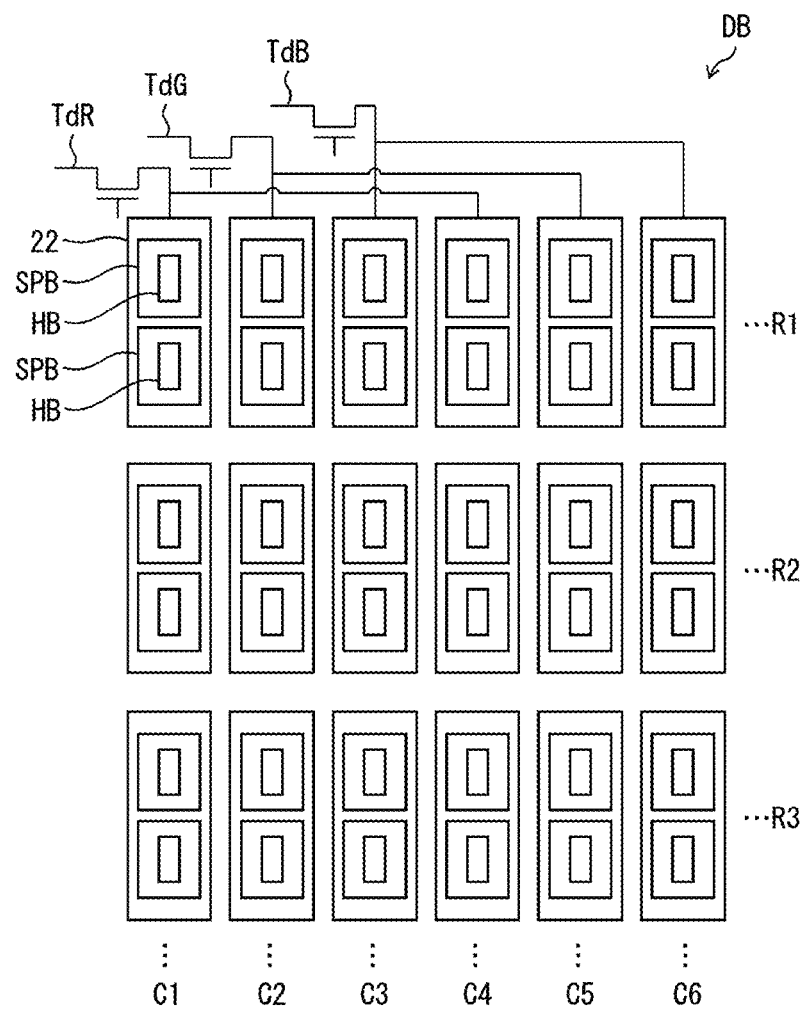
FIG. 9 is a plan view illustrating the configuration of a peripheral display region according to a second embodiment.

FIG. 9 is a plan view illustrating the configuration of the peripheral display region DB according to a second embodiment. Of all the subpixels SPB arranged in the peripheral display region DB, FIG. 9 illustrates three rows'×six columns' worth of the subpixels SPB. The three rows are called rows R1, R2, and R3, in that order from the top to the bottom in FIG. 9, and the six columns are called C1, C2, . . . , C6, in that order from the left to the right in FIG. 9. In FIG. 9, the position where a given row Rn and a given column Cn intersect is called a position (Rn, Cn). For example, the position where the row R1 and the column C1 intersect is a position (R1, C1).

In FIG. 9, the plurality of subpixels SPB arranged in the peripheral display region DB include subpixels SPB that display red, subpixels SPB that display green, and subpixels SPB that display blue. The red subpixels SPB, the green subpixels SPB, and the blue subpixels SPB are arranged repeatedly, in that order, following the row direction in each row. At each position, two of the subpixels SPB that display the same color are arranged side-by-side following the column direction. Specifically, the two subpixels SPB arranged at the position (R1, C1) and the two subpixels SPB arranged at the position (R4, C1) are all red subpixels SPB. The two subpixels SPB arranged at the position (R2, C1) and the two subpixels SPB arranged at the position (R5, C1) are all green subpixels SPB. The two subpixels SPB arranged at the position (R3, C1) and the two subpixels SPB arranged at the position (R6, C1) are all blue subpixels SPB.

In the present embodiment, in the peripheral display region DB, a plurality of subpixels SPB displaying the same color can be arranged side-by-side in the column direction. In this case, a plurality of subpixels SPA arranged side-by-side in the column direction are driven by a common image signal. Furthermore, the plurality of subpixels SPB arranged side-by-side in the column direction are electrically connected to a common single anode electrode 22.

As illustrated in FIG. 9, the peripheral display region DB further includes a plurality of light emission control transistors (active elements) TdR, TdG, and TdB. The light emission control transistors TdR control the light emission of the red subpixels SPB, the light emission control transistors TdG control the light emission of the green subpixels SPB, and the light emission control transistors TdB control the light emission of the blue subpixels SPB. In FIG. 9, each of the plurality of subpixels SPB arranged in the peripheral display region DB is driven by an individual image signal corresponding to that type of display color. Specifically, the red subpixels SPB are driven by an image signal provided by the light emission control transistors TdR. The green subpixels SPB are driven by an image signal provided by the light emission control transistors TdG. The blue subpixels SPB are driven by an image signal provided by the light emission control transistors TdB.

In FIG. 9, at each position (Rn, Cn), two subpixels SPB adjacent in the column direction are electrically connected to a common anode electrode 22. The common anode electrode 22 formed in the peripheral display region DB is larger than the individual anode electrodes 22 electrically connected to subpixels SPA formed in the display region DA, and is also common to two of the subpixels SPB. In the peripheral display region DB, the individual anode electrodes 22 are connected to the drain electrode of any one of the light emission control transistors Td. For example, the common anode electrode 22 arranged at position (C1, R1) is connected to the drain electrode of the light emission control transistor TdR. Accordingly, the two subpixels SPB arranged at each position (Rn, Cn) are by necessity driven at the same time. In other words, the display device 1 cannot individually drive two subpixels SPB electrically connected to a common anode electrode 22.

In the peripheral display region DB, only a single line is necessary to connect the two subpixels SPB arranged at each position (Rn, Cn) to the corresponding light emission control transistor Td. In other words, a wiring line for connecting one of the two subpixels SPB to the corresponding other light emission control transistor Td need not be provided in the peripheral display region DB. Accordingly, the number of necessary wiring lines in the peripheral display region DB can be reduced, which can make it easier to design the subpixel structure in the peripheral display region DB. Furthermore, wiring lines that connect different anode electrodes 22 to each other are not needed in the peripheral display region DB, which makes it possible to freely lay out the regions in layers below the anode electrodes 22 in the peripheral display region DB. A monolithic gate driver or the like, for example, can therefore be formed in the peripheral display region DB.

In the peripheral display region DB, a plurality of the subpixels SPB, in a group of the subpixels SPB, which are arranged at different positions, are electrically connected to a common light emission control transistor Td among the plurality of light emission control transistors TdR, TdG, and TdB. For example, the two subpixels SPB arranged at position (R1, C1) and the two subpixels SPB arranged at the position (R4, C1) three places to the right are electrically connected to the drain electrode of a common light emission control transistor TdR. In other words, four red subpixels SPB are electrically connected to a single light emission control transistor TdR.

In FIG. 9, the relationship "light emission control transistor Td:subpixels SPB=1:4" holds true at all locations in the peripheral display region DB. For example, the two green subpixels SPB arranged at position (R2, C1) and the two green subpixels SPB arranged at the position (R5, C1) are electrically connected to a common light emission control transistor TdG. Furthermore, the two blue subpixels SPB arranged at position (R3, C1) and the two blue subpixels SPB arranged at the position (R6, C1) are electrically connected to a common light emission control transistor TdB.

Based on this, of all the light emission control transistors Td formed in the peripheral display region DB, one quarter of those transistors are connected to any one of the subpixels SPB. The remaining three quarters need not be connected to subpixels SPB. As such, the locations in the peripheral display region DB where these remaining subpixels SPB are formed can be, for example, incorporated into the gate drivers or used as part of TFTs used for time-division switched driving.

Configuration of Subpixels SPB

Figure 10:
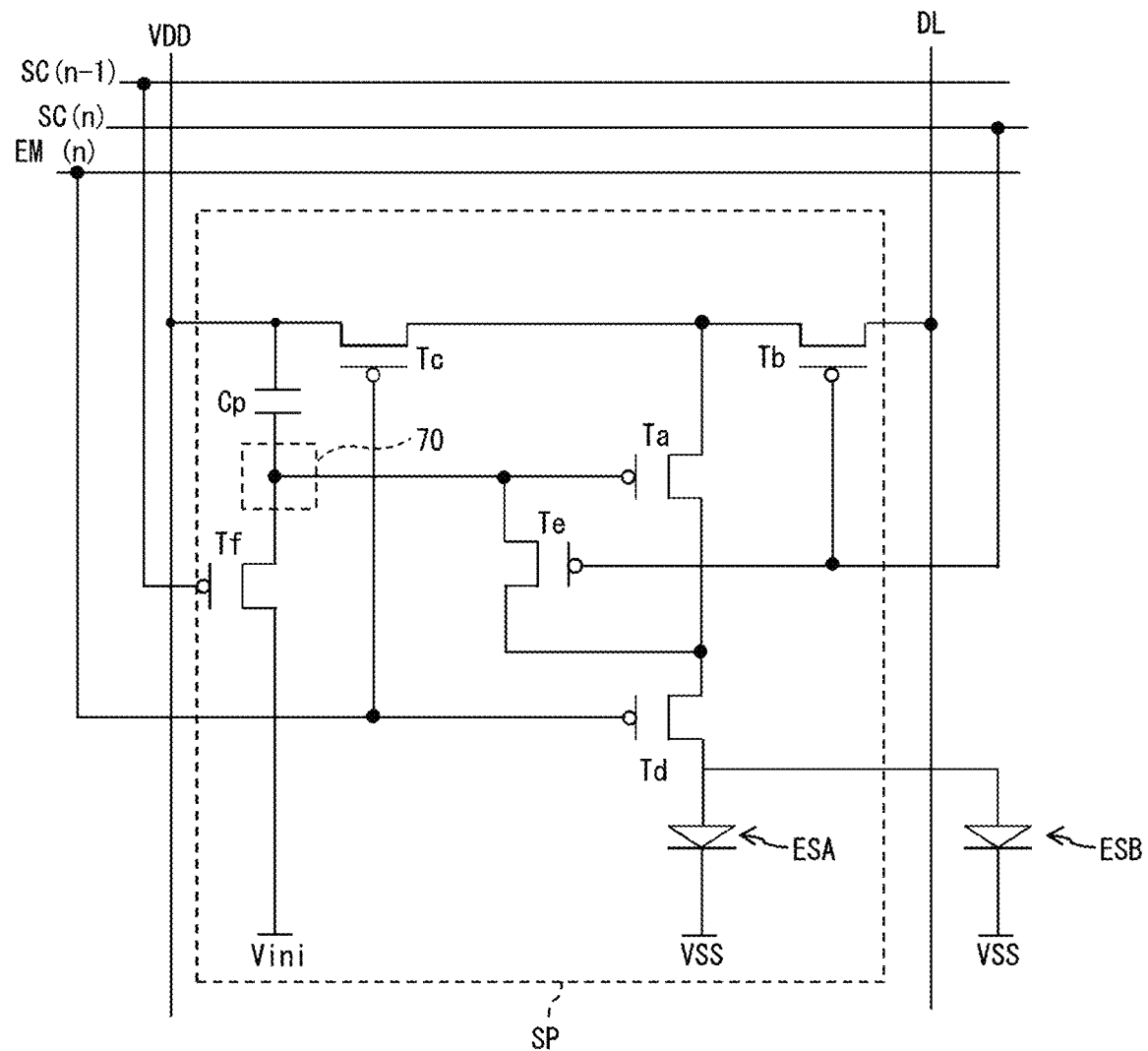
FIG. 10 is a circuit diagram illustrating an example of the configuration of subpixels according to the second embodiment.

FIG. 10 is a circuit diagram illustrating an example of the configuration of the subpixels SPB according to the second embodiment. In the peripheral display region DB, a plurality of data lines DL extending in the column direction, as well as a plurality of scanning lines SC(n) and a plurality of light emission control wiring lines EM(n), are provided in the TFT layer 4. The subpixels SPB are connected to the data lines DL and the scanning lines SC(n). Note that a high-level power source VDD and a low-level power source VSS for driving the organic EL element, and an initialization voltage Vini, are supplied to each of the subpixels SPB. During the period where the scanning lines SC(n) are active, potential signals based on display gray scale data are supplied from the data lines DL to the subpixels connected thereto.

Each subpixel SPB includes a driving transistor Ta, a switching transistor Tb, a power supply control transistor Tc, a light emission control transistor Td, a threshold voltage compensation transistor Te, an initialization transistor Tf, and an electrostatic capacitance Cp, which are formed in the TFT layer 4 illustrated in FIG. 2; and a light emitting element ESA (e.g., an organic light emitting diode) including the light-emitting layer 24, which is formed in the light-emitting element layer 5 illustrated in FIG. 2. The transistors Ta to Tf are all examples of the thin film transistor Tr.

In the driving transistor Ta, the gate electrode is connected to the source electrode of the threshold voltage compensation transistor Te, the drain electrode of the initialization transistor Tf, and one capacitance electrode forming the electrostatic capacitance Cp; the drain electrode is connected to the source electrode of the switching transistor Tb and the source electrode of the power supply control transistor Tc; and the source electrode is connected to the drain electrode of the light emission control transistor Td and the drain electrode of the threshold voltage compensation transistor Te.

In the switching transistor Tb, the gate electrode is connected to the scanning line SC(n) in the nth row; the drain electrode is connected to the data line DL; and the source electrode is connected to the drain electrode of the driving transistor Ta and the source electrode of the power supply control transistor Tc. In the power supply control transistor Tc, the gate electrode is connected to the light emission control wiring line EM(n) in the nth row; the drain electrode is connected to a supply line for the high-level power source VDD and the other of the capacitance electrodes forming the electrostatic capacitance Cp; and the source electrode is connected to the drain electrode of the driving transistor Ta and the source electrode of the switching transistor Tb.

The anode electrode 22 of the light emitting element ESA in the subpixel SPB is connected to the drain electrode of the light emission control transistor Td. The cathode electrode 25 of the light emitting element ESA is connected to a supply line for the low-level power source VSS. The drain electrode of the light emission control transistor Td is connected in parallel with the anode electrode 22 of a light emitting element ESB of another subpixel SPB, which emits the same color of light as the color displayed by the subpixel SPB and which is disposed closest to that subpixel SPB. The cathode electrode 25 of the light emitting element ESB is connected to a supply line for the low-level power source VSS. If, for example, the subpixel SPB illustrated in FIG. 10 is a red subpixel SPB arranged at position (R1, C1) in FIG. 9, the light emission control transistor Td illustrated in FIG. 10 is a light emission control transistor TdR. Furthermore, the light emitting element ESA illustrated in FIG. 10 is a light emitting element included in the light-emitting layer 24 constituting the red subpixel SPB arranged at position (R1, C1), and the light emitting element ESB illustrated in FIG. 10 is a light emitting element included in the light-emitting layer 24 constituting the red subpixel SPB arranged at position (R1, C4).

Note that in the peripheral display region DB, individual anode electrodes 22, which are connected individually to individual subpixels SPB, can be formed as well. In this case, the anode electrodes 22 formed in the peripheral display region DB can be set to the same size as the anode electrodes 22 formed in the display region DA, or to a smaller size. According to this configuration as well, a plurality of individual anode electrodes 22 can be electrically connected to a common light emission control transistor Td. Specifically, the anode electrodes 22 are electrically connected by lead wiring lines formed in the peripheral display region DB, and furthermore, any of the plurality of electrically-connected anode electrodes 22 is connected to a common light emission control transistor Td.

Modification

In the first or second embodiment, the surface area of the openings HB formed in the subpixels SPB arranged in the four corners of the peripheral display region DB is preferably smaller than the surface area of the openings HB formed in the subpixels SPB arranged in parts aside from the four corners of the peripheral display region DB. This makes it possible to more easily form correctly-functioning subpixels SPB in the four corners of the peripheral display region DB, where the deposition precision of the luminescent material can be the lowest.

An electro-optical element (an electro-optical element whose luminance and transmittance are controlled by an electric current) that is provided in the display device 2 according to the present embodiment is not particularly limited. Examples of the display device 2 according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

Supplement

Aspect 1: a display device including: a first electrode; a flattening film formed in a layer above the first electrode and covering an end portion of the first electrode; a light-emitting layer formed in a layer above the first electrode; and a second electrode formed in a layer above the light-emitting layer, wherein the display device includes a first display region, and a second display region formed in a periphery of the first display region; a first opening formed on an inner side of a first pixel electrode, the first pixel electrode being the first electrode formed in the first display region, is larger than a second opening formed on an inner side of a second pixel electrode, the second pixel electrode being the first electrode formed in the second display region; and a first light-emitting layer, the first light-emitting layer being the light-emitting layer formed in the first display region, has equal shape and equal size to a second light-emitting layer, the second light-emitting layer being the light-emitting layer formed in the second display region.

Aspect 2: the display device according to aspect 1, wherein the second pixel electrode is smaller than the first pixel electrode.

Aspect 3: the display device according to aspect 2, further including: an authentication sensor, the authentication sensor being provided in the second display region on a rear face opposing a display surface, and overlapping a part of the second display region where the second pixel electrode is formed.

Aspect 4: the display device according to aspect 1, further including: a plurality of second pixels, the second pixels being formed in the second display region and including the second light-emitting layer, wherein each of the plurality of second pixels is driven individually by each image signals.

Aspect 5: the display device according to aspect 1, further including: a plurality of second pixels, the second pixels being formed in the second display region and including the second light-emitting layer, wherein the plurality of second pixels are electrically connected to the common second pixel electrode.

Aspect 6: the display device according to aspect 1, further including: a plurality of second pixels, the second pixels being formed in the second display region and including the second light-emitting layer, wherein the second pixel electrode is larger than the first pixel electrode, and is common to the plurality of second pixels.

Aspect 7: the display device according to aspect 5 or 6, wherein the plurality of second pixels emit the same color of light.

Aspect 8: the display device according to aspect 7, wherein the plurality of second pixels are arranged side-by-side in a row direction or a column direction in the second display region, and are driven by a common image signal.

Aspect 9: the display device according to aspect 1, further including: a plurality of second pixels, the second pixels being formed in the second display region and including the second light-emitting layer; and a plurality of active elements formed in the second display region, wherein the plurality of second pixels are connected to one common active element among the plurality of active elements.

Aspect 10: the display device according to any one of aspects 1 to 9, further including: a display control circuit formed in the second display region.

Aspect 11: the display device according to aspect 10, wherein the display control circuit is a monolithic gate driver.

Aspect 12: the display device according to aspect 1, further including: a lead wiring line that transfers a signal from the exterior to the first display region, wherein the lead wiring line overlaps with the second light-emitting layer in the second display region.

Aspect 13: the display device according to any one of aspects 1 to 12, wherein a notch part is formed in the interior of the first display region, the notch part being formed by cutting out part of the first display region; and the second display region is formed between the notch part and the first display region, surrounding the notch part.

Aspect 14: the display device according to any one of aspects 1 to 12, wherein the display device includes the first display region, the second display region, and a frame region formed surrounding the first display region; a notch part is formed in an end portion of the display device, the notch part being formed by cutting out part of the first display region and part of the frame region; and the second display region is formed between the notch part and the first display region in contact with the notch part.

The disclosure is not intended to be limited to the above-described embodiments, and many changes are possible within the scope indicated by the appended claims. Embodiments obtained by appropriately combining technical approaches disclosed in each of the different embodiments also fall within the technical scope of the disclosure. Novel technical features can also be formed by combining the technical approaches stated in each of the embodiments.

REFERENCE SIGNS LIST

1 Display device
DA Display region (first display region)
DB Peripheral display region (second display region)
DC Frame region
SPA Subpixel (first pixel)
SPB Subpixel (second pixel)
22 Anode electrode (first electrode, first pixel electrode, second pixel electrode)
23 Flattening film
HA Opening (first opening)
HB Opening (second opening)
24 Light-emitting layer (first light-emitting layer, second light-emitting layer)
TdR Light emission control transistor (driving element)
TdB Light emission control transistor (driving element)
TdG Light emission control transistor (driving element)

The invention claimed is:

1. A display device comprising:
a first electrode;
a flattening film formed in a layer above the first electrode and covering an end portion of the first electrode;
a light-emitting layer formed in a layer above the first electrode; and
a second electrode formed in a layer above the light-emitting layer, wherein
the display device includes a first display region, and a second display region formed in a periphery of the first display region,
a first opening formed on an inner side of a first pixel electrode, the first pixel electrode being the first electrode formed in the first display region, is larger than a second opening formed on an inner side of a second pixel electrode, the second pixel electrode being the first electrode formed in the second display region, and
a first light-emitting layer, the first light-emitting layer being the light-emitting layer formed in the first display region, has equal shape and equal size to a second light-emitting layer, the second light-emitting layer being the light-emitting layer formed in the second display region.

2. The display device according to claim 1, wherein the second pixel electrode is smaller than the first pixel electrode.

3. The display device according to claim 2, further comprising:
an authentication sensor, the authentication sensor being provided in the second display region on a rear face opposing a display surface, and overlapping a part of the second display region where the second pixel electrode is formed.

4. The display device according to claim 1, further comprising:
a plurality of second pixels, the second pixels being in the second display region and including the second light-emitting layer, wherein
each of the plurality of second pixels is driven individually by a common image signal.

5. The display device according to claim 1, further comprising:
a plurality of second pixels, the second pixels being in the second display region and including the second light-emitting layer, wherein
the plurality of second pixels are electrically connected to a common single second pixel electrode that is a portion of the second pixel electrode.

6. The display device according to claim 1, further comprising:
a plurality of second pixels, the second pixels being formed in the second display region and including the second light-emitting layer, wherein
the second pixel electrode is larger than the first pixel electrode, and is common to the plurality of second pixels.

7. The display device according to claim 5, wherein the plurality of second pixels emit the same color of light.

8. The display device according to claim 7, wherein the plurality of second pixels are arranged side-by-side in a row direction or a column direction in the second display region, and are driven by a common image signal.

9. The display device according to claim 1, further comprising:
a plurality of second pixels, the second pixels being formed in the second display region and including the second light-emitting layer; and
a plurality of active elements formed in the second display region, wherein
the plurality of second pixels are connected to one common active element among the plurality of active elements.

10. The display device according to claim 1, further comprising:
a display control circuit formed in the second display region.

11. The display device according to claim 10, wherein the display control circuit is a monolithic gate driver.

12. The display device according to claim 1, further comprising:
- a lead wiring line that transfers a signal from an exterior to the first display region, wherein
- the lead wiring line overlaps with the second light-emitting layer in the second display region.

13. The display device according to claim 1, wherein
- a notch is in an interior of the first display region, the notch being formed by cutting out a portion of the first display region, and
- the second display region is between the notch and the first display region, surrounding the notch.

14. The display device according to claim 1, wherein
- the display device includes the first display region, the second display region, and a frame region surrounding the first display region,
- a notch is in an end portion of the display device, the notch being formed by cutting a portion of the first display region and a portion of the frame region, and
- the second display region is between the notch and the first display region in contact with the notch.

\* \* \* \* \*